United States Patent
King et al.

(10) Patent No.: US 7,233,201 B2
(45) Date of Patent: Jun. 19, 2007

(54) SINGLE-ENDED PSEUDO-DIFFERENTIAL OUTPUT DRIVER

(75) Inventors: Gregory King, Lakeville, MN (US); Robert Rabe, Chanhassen, MN (US)

(73) Assignee: Micron Technology, Inc., Boise, ID (US)

( * ) Notice: Subject to any disclaimer, the term of this patent is extended or adjusted under 35 U.S.C. 154(b) by 40 days.

(21) Appl. No.: 10/931,362

(22) Filed: Aug. 31, 2004

(65) Prior Publication Data

US 2006/0044069 A1   Mar. 2, 2006

(51) Int. Cl.
 *H03F 3/45* (2006.01)
(52) U.S. Cl. ............... 330/252; 330/253; 330/258; 330/260; 330/261; 330/275; 330/296; 330/301; 327/563
(58) Field of Classification Search ............... 327/563; 330/258, 260, 261, 301, 253, 252, 296, 275
 See application file for complete search history.

(56) References Cited

U.S. PATENT DOCUMENTS

| | | | |
|---|---|---|---|
| 5,889,304 A | 3/1999 | Watanabe et al. | |
| 5,946,230 A | 8/1999 | Shimizu et al. | |
| 6,028,480 A * | 2/2000 | Seevinck et al. | 330/257 |
| 6,049,482 A | 4/2000 | Aritome et al. | |
| 6,240,012 B1 | 5/2001 | Nakamura et al. | |
| 6,265,739 B1 | 7/2001 | Yaegashi et al. | |
| 6,337,805 B1 | 1/2002 | Forbes et al. | |
| 6,353,242 B1 | 3/2002 | Watanabe et al. | |
| 6,413,809 B2 | 7/2002 | Nakamura et al. | |
| 6,461,915 B1 | 10/2002 | Rudeck | |
| 6,495,896 B1 | 12/2002 | Yaegashi et al. | |
| 6,611,010 B2 | 8/2003 | Goda et al. | |
| 6,759,707 B2 * | 7/2004 | Prall et al. | |
| 6,825,721 B2 * | 11/2004 | Sanchez et al. | 330/253 |
| 6,828,627 B2 | 12/2004 | Goda et al. | |
| 6,849,501 B2 | 2/2005 | Rudeck | |
| 6,891,246 B2 | 5/2005 | Aritome et al. | |
| 6,951,790 B1 | 10/2005 | Violette | |
| 2003/0011432 A1 * | 1/2003 | Cecchi et al. | 330/258 |

* cited by examiner

*Primary Examiner*—Michael B. Shingleton
(74) *Attorney, Agent, or Firm*—Schwegman, Lundberg, Woessner & Kluth, P.A.

(57) ABSTRACT

A differential pair of transistors includes a first transistor and a second transistor having their sources coupled together. Their sources are further coupled to ground via a pull-down network. A single-ended output is coupled to the drain of the second of the pair of differential transistors. A differential current adjust circuit is coupled to a drain of the first of the pair of differential transistors, and the current adjust circuit is configured so that the second side of the differential output driver circuit conducts approximately the same current as the first side of the differential output driver circuit.

20 Claims, 3 Drawing Sheets

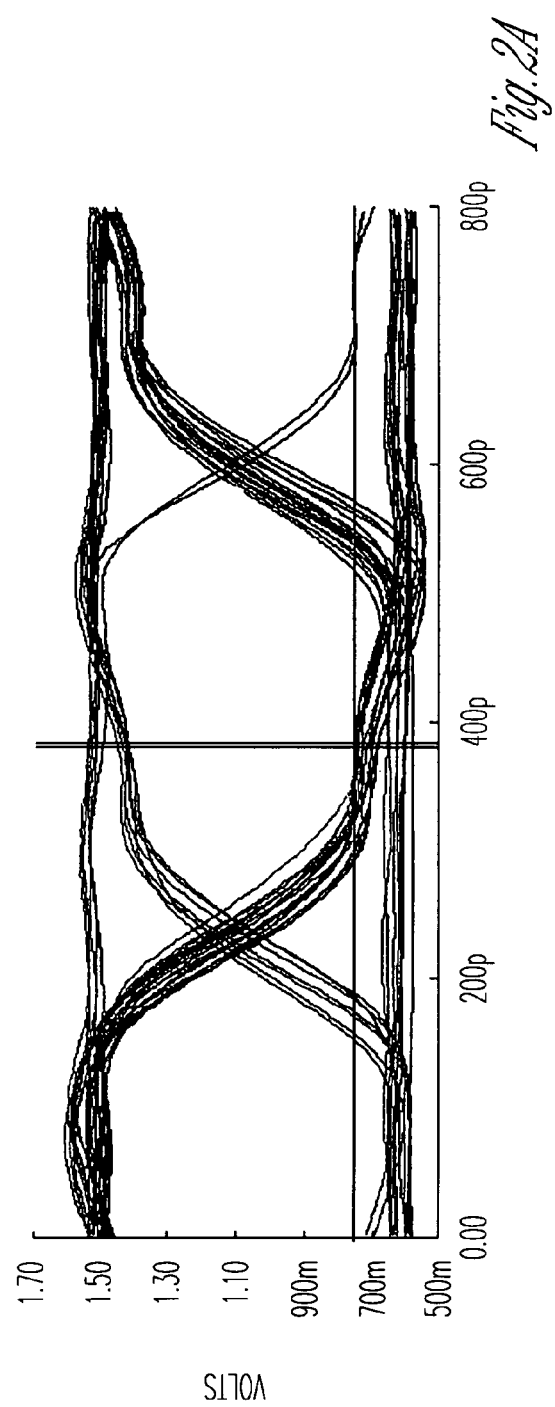
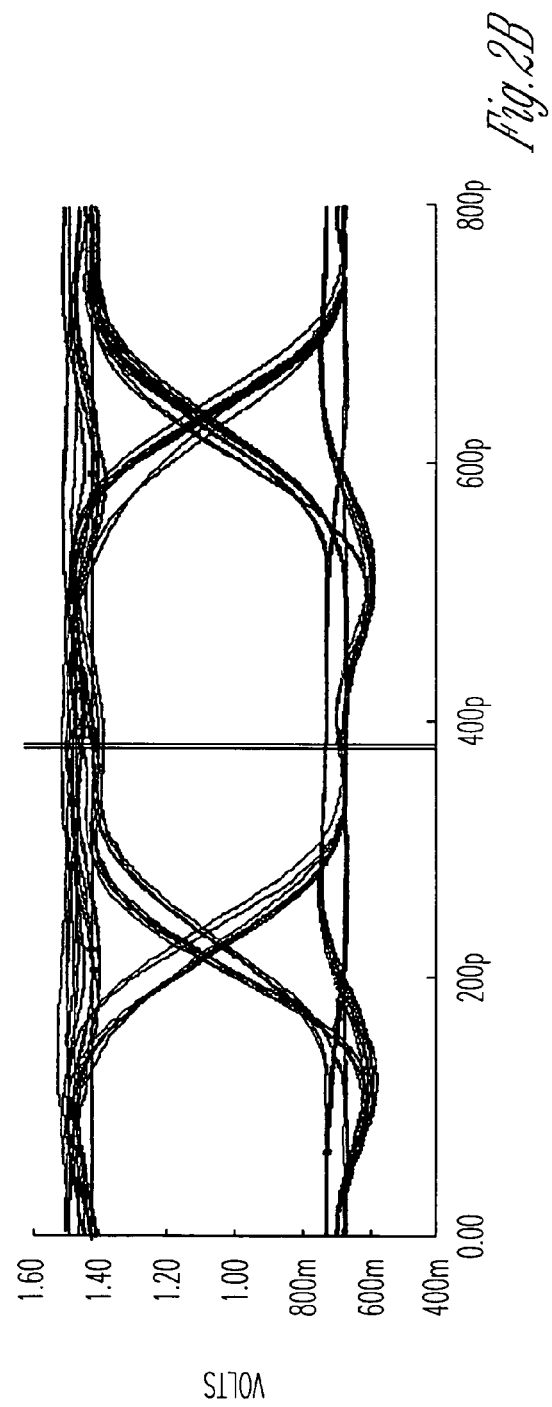
Fig. 2A
Fig. 2B

SINGLE-ENDED PSEUDO-DIFFERENTIAL OUTPUT DRIVER

FIELD OF THE INVENTION

The invention relates generally to output driver circuits, and more specifically to a differential circuit operable to provide a single-ended pseudo-differential output signal.

BACKGROUND OF THE INVENTION

Electronic circuits are often constructed of several different functional units or modules that communicate with each other to provide some function more complex than each of the component modules could themselves perform. Simply looking at the circuit board in most electronic devices will reveal a variety of components, including multiple integrated circuits or "chips" that are the modules from which a larger circuit is constructed.

These components are typically linked by conductive copper traces on a printed circuit board, which serve to conduct signals from one portion of a circuit to another. Each chip typically performs one or more functions on received electrical signals, and outputs electrical signals to another component or to an interface such as a display. Communication of signals between components has become more complex as the speed of devices such as computer processors and memory have increased and power efficiency continues to improve. Higher signal frequencies result in a noisier electrical environment, and lower power signals are inherently more susceptible to noise or interference picked up in the conductors linking electrical devices in a circuit.

One method of reducing the influence of noise or interference in conductors, whether between circuit modules inches away or between electric devices miles apart, is to send signals as differential signals instead of as single-ended signals. In single-ended signals, a single signal line changes voltage relative to a ground or reference voltage level that remains constant. Electromagnetic interference received in the signal conductor will cause its voltage level to change, resulting in a change in the intended signal level relative to the chosen reference potential. Noise from the power source used to generate the signal is also conducted over the signal line, resulting in deviation from the intended signal voltage level.

Differential signals are sent over two signal lines, such that a positive change in voltage in one signal line is mirrored by a negative change in voltage in the other signal line. Because the difference between signal lines is detected to determine the signal state, noise picked up by both signal lines will not be detected since the interference will be essentially the same in both differential signal lines. Also, power supply fluctuations in the circuit creating the differential signal have less of an effect on the differential signal due to the construction of typical differential driver circuits. The advantages of differential signal drivers are therefore substantial in a noisy or high-speed signal environment, but are offset somewhat by the added complexity of the differential driver circuit and the need for two signal lines to carry the differential signal.

It is therefore desired to retain advantages of differential signaling while using a single signal conductor.

BRIEF DESCRIPTION OF THE FIGURES

FIG. 2a shows an eye chart of simulated example output performance of a single-ended output driver.

FIG. 2b shows an eye chart of simulated example output performance of a pseudo-differential single-ended output driver.

SUMMARY

A differential pair of transistors includes a first transistor and a second transistor having their sources coupled together. Their sources are further coupled to ground via a pull-down network. A single-ended output is coupled to the drain of the second of the pair of differential transistors. A differential current adjust circuit is coupled to a drain of the first of the pair of differential transistors, and the current adjust circuit is configured so that the second side of the differential output driver circuit conducts approximately the same current as the first side of the differential output driver circuit.

DETAILED DESCRIPTION

In the following detailed description of sample embodiments of the invention, reference is made to the accompanying drawings which form a part hereof, and in which is shown by way of illustration specific sample embodments in which the invention may be practiced. These embodiments are described in sufficient detail to enable those skilled in the art to practice the invention, and it is to be understood that other embodiments may be utilized and that logical, mechanical, electrical, and other changes may be made without departing from the scope of the present invention. The following detailed description is, therefore, not to be taken in a limiting sense, and the scope of the invention is defined only by the appended claims.

One example has a differential pair of transistors, including a first transistor and a second transistor having their sources coupled together. Their sources are further coupled to ground via a pull-down network. A single-ended output is coupled to the drain of the second of the pair of differential transistors. A differential current adjust circuit is coupled to a drain of the first of the pair of differential transistors, and the current adjust circuit is configured so that the second side of the differential output driver circuit conducts approximately the same current as the first side of the differential output driver circuit.

Figure 1:
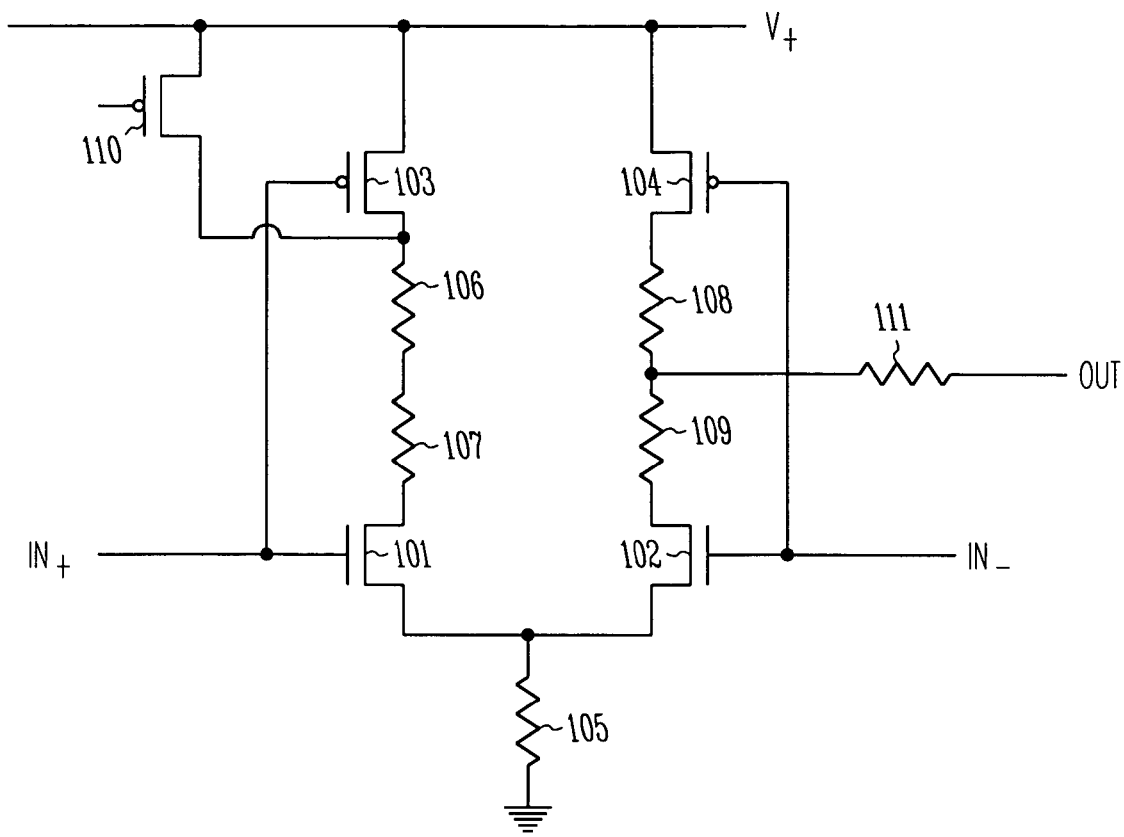
FIG. 1 shows an example differential output driver circuit with a pseudo-differential output and a current adjust circuit.

FIG. 1 illustrates such a circuit in greater detail. Transistor 101 and 102 form a differential pair of transistors, each connected to one leg of the differential circuit. Transistors 101 and 102 are coupled to receive a differential input signal that includes two signal lines. The gate of transistor 101 is coupled to one of the differential input signal lines, and the gate of transistor 102 is coupled to the other of the differential input signal lines. The differential input signal lines will typically carry a differential signal, such that variations in the signal voltage in one of the signal lines are matched by an equal variation in the signal voltage in the other signal line, but in the opposite direction. For example, a 3.3 Volt increase in the differential input signal line coupled to transistor 101 will be matched by a 3.3 Volt decrease in the differential input signal line coupled to transistor 102.

The differential input line coupled to transistor 101 is also coupled to the gate of transistor 103, and the other differential input line that is coupled to transistor 102 is also coupled to the gate of transistor 104. Transistors 103 and 104 are p-type FET transistors, also known as PFETs or field-effect transistors having a p-type channel, while transistors 101 and 102 are n-type or NFET transistors. The sources of transistors 101 and 102 are coupled together, and are further coupled to ground via impedance 105. In some embodiments, impedance 105 is a variable impedance, such as a transistor with conductance that varies dependent on the signal applied to its gate. The drain of transistor 101 is coupled to the source of transistor 103 via resistors 106 and 107, which in other embodiments are replaced with a single resistor. Similarly, resistors 108 and 109 are connected in series and link the source of transistor 104 to the drain of transistor 102. In alternate embodiments, an output resistor 111 is added, or is present and resistors 106, 107, 108, and 109 are not present.

A supply voltage V+ is coupled to the sources of transistors 103 and 104. The supply voltage will vary in different embodiments, and is typically a higher or lower voltage than the ground or reference potential. Examples include a 5 volt, 3.3 volt, 1.5 volt, or other such voltage provided by a power supply to power the circuit. The supply voltage is further coupled to the source of a transistor 110, which has its drain coupled to the drain of transistor 103. The gate of transistor 110 is coupled to a control signal, such that by varying the control signal the conductivity and therefore the current flowing through transistor 110 can be varied.

A single-ended output is coupled to the junction between resistors 108 and 109. Although the output is single-ended, meaning it provides a single signal as an output that varies relative to a ground or reference voltage, it is also a pseudo-differential output because it is provided by a differential output driver circuit.

In operation, the circuit receives a differential signal in two differential pair of transistors. N-type transistor 101 and p-type transistor 103 receive at their gates a part of the differential signal received on a first signal line, and n-type transistor 102 and p-type transistor 104 receive at their gates the other part of the differential signal received on the other differential signal line. When the received signal is at a high voltage level, the n-type transistors to which the signal is coupled via the transistor's gates have a reduced impedance to electric current flow and conduct current, while the p-type transistors have an increased impedance to current flow and conduct less current. For example, when the in-signal line coupled to transistors 102 and 104 is at a higher voltage level, transistor 102 has a lower impedance and transistor 104 has a higher impedance, resulting in the voltage level at the output between resistors 108 and 109 being closer to the ground or reference potential than to the supply voltage level. When the in-signal line coupled to transistors 102 and 104 is at a lower voltage level, such as a voltage near the ground voltage level rather than near the higher supply voltage level, n-type transistor 102 has a relatively high impedance while p-type transistor 104 has a relatively low impedance. This results in a lower impedance between the output and the supply rail than between the output and the ground, causing the output signal to have a higher voltage.

The opposite leg of the differential circuit comprising transistors 101 and 103 operates similarly, except that there is no output coupled between resistors 106 and 107, and the input signal in+ varies opposite the input signal in−. Assuming a differential input signal is received, the voltage at the junction between resistors 106 and 107 will rise when the output voltage falls, and will fall when the output voltage rises.

Resistor 105 may be used to control the output impedance, and in some embodiments has a variable impedance or is a current source such as a Widlar current source. In one example, the resistor 105 or current source is variable, such that the amount of current flowing through both legs of the differential circuit to ground can be controlled.

Transistor 110 is also a PMOS transistor, and can be controlled by a control signal coupled to its gate. The control signal is varied in one example, making the amount of power consumed by the differential driver circuit of FIG. 1 configurable. Increasing the amount of current flowing through the leg of the differential circuit that is not coupled to the output increases immunity to noise received on the supply voltage line, albeit at the expense of somewhat higher power consumption in the circuit. In one example circuit, the signal provided to the gate of transistor 110 is adjusted so that the differential leg including transistor 101 conducts the same current as the differential leg including transistor 102 in the differential driver circuit. Regulation of current flow is achieved in one example by monitoring or detecting the current flowing through the leg of the differential current pair to which the single-ended output is coupled, and adjusting the voltage signal sent to the gate of transistor 110 accordingly to achieve a desired current flow through the opposite leg.

Supply voltage noise is often observed in digital clocked circuits, and is called simultaneous switching noise in such environments. The noise results from changes in load being placed on the supply voltage line as various circuit components transition from one state to the next, which typically happens on a transition of a system clock used to coordinate activity in digital circuits. The switching noise is in part due to the imperfection of the power supply and the resistance present in the voltage supply lines. As the current drawn changes near a clock cycle, the voltage drop across the voltage supply lines and within a regulated power supply change, resulting in a brief but measurable variation in voltage present on the voltage supply lines. The differential nature of this example embodiment of the invention further presents a more constant load to the power supply, thereby reducing power supply drawn current variation and resulting voltage variations.

Although the transistors shown and described in FIG. 1 have been described as having sources and drains, such labels are applied only to uniquely identify certain terminals of the transistor, and to distinguish them from the transistor's gate terminal. Typical FET construction yields transistors that have sources and drains that are interchangeable, and the source and drain can be interchanged in the examples given here and in the embodiments recited in the claims.

FIG. 2*a* shows the simulated performance of a typical single-ended output driver, in what is known in the art as an eye pattern. It is referred to as such because the series of superimposed signal transitions form an eye-shaped opening in the center of the pattern. The quality of the signal can be visually estimated in part by observing the nature of the eye and of the transition lines that define it—the slope of the lines shows how quickly the signal is able to change between values, and the horizontal offset between lines undergoing the same transition shows jitter. The graph in FIGS. 2*a* and 2*b* show voltage in Volts versus time in picoseconds, and illustrates several example signal level transitions in a 1.5 Volt digital logic circuit. Note particularly in FIG. 2*a* that as the voltage level changes from high to low or from low to high over time, that the variation in time it takes to transition and the time it takes to settle to the final voltage are both significant. FIG. 2b shows the results of substitution of a pseudo-differential driver like that of FIG. 1, resulting in a faster transition to the desired voltage, and reduced variance or jitter between various instances of signal transitions.

This illustrates how the output signal is able to settle faster, and therefore operate at a higher rate or clock frequency than the same system employing a single-ended output driver. The reduction in jitter and simultaneous switching noise enables faster, more accurate determination of the intended level of the output signal after a clock transition, improving performance and reliability of the circuit.

Figure 3:
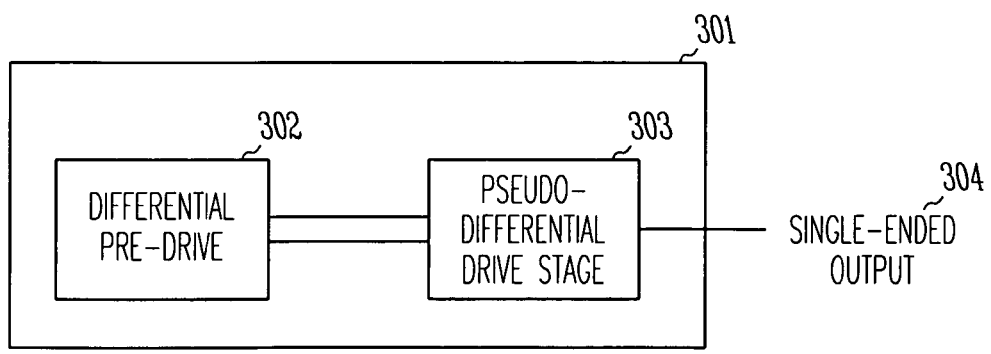
FIG. 3 is a block diagram of an example system employing a pseudo-differential output driver.

FIG. 3 illustrates an example implementation of a pseudo-differential driver having a single-ended output in an electronic circuit or system. The electronic module 301 generates a signal to be output, which is provided as a differential signal from the differential pre-drive element 302. The differential signal is received on two signal lines or conductors by the pseudo-differential drive stage, such as the example shown in FIG. 1. The pseudo-differential drive stage outputs a single-ended output signal on a single line, which is routed outside the electronic module 301 for coupling to other electronic circuit elements.

Figure 4:
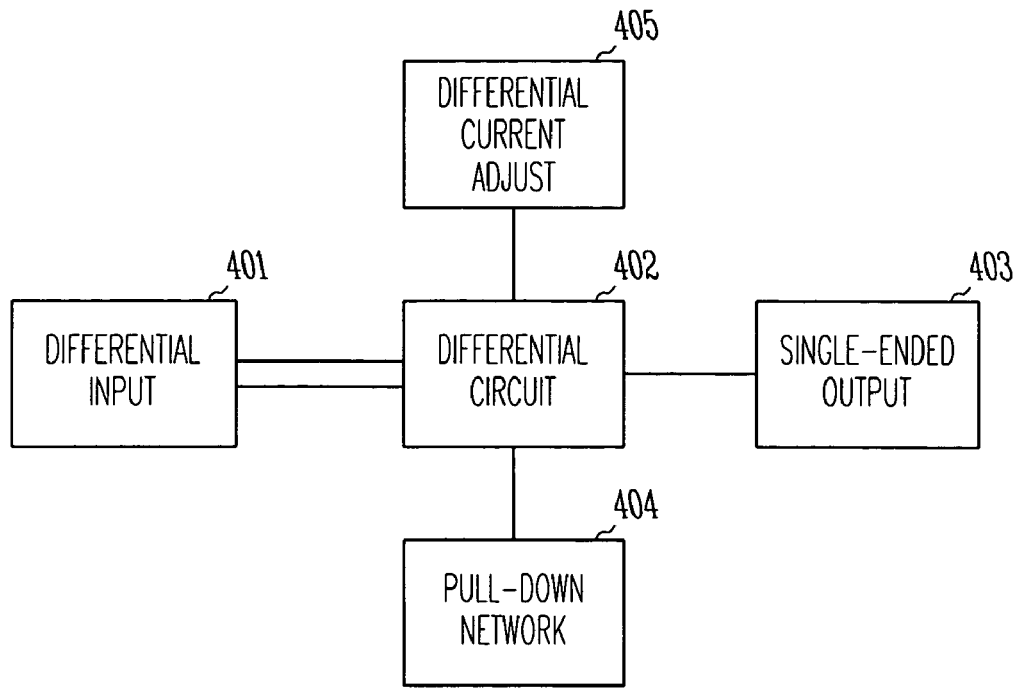
FIG. 4 shows an example block diagram of a pseud-differential output driver circuit.

FIG. 4 illustrates a block diagram of a pseudo-differential driver circuit having a single-ended output. A differential input is received in the circuit at 401, which in various examples includes a pre-drive differential circuit or simply an electrical connection to a pair of differential signal lines. The differential signal is received via at least two differential signal lines in a differential driver circuit 402, which provides an amplified or driven single-ended output signal at 403. The differential circuit is coupled to a reference potential such as ground via the pull-down network 404, which is in some embodiments adjustable or programmable to vary the current flowing through the differential circuit 402. A differential adjust circuit 405 is operable to control or adjust the current passing through one leg of the differential circuit, which in one example is the leg opposite the leg coupled to the single-ended output.

Figure 5:
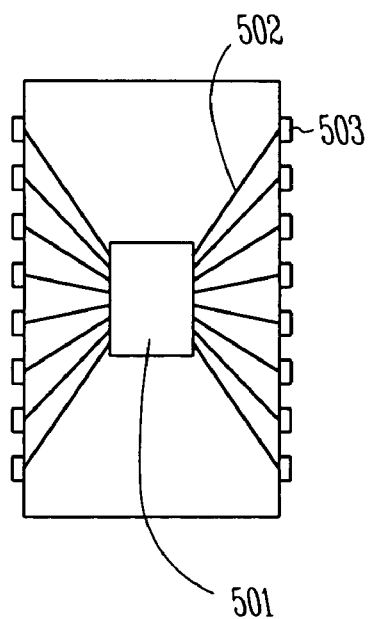
FIG. 5 shows an example integrated circuit incorporating a pseudo-differential single-ended output driver.

Some examples of the invention will be implemented in various integrated circuits (ICs) to communicate signals to other circuit components, such as other integrated circuits. FIG. 5 shows generally an integrated circuit, comprising a die 501 which contains various circuit components such as transistors and resistors. The die includes a pseudo-differential single-ended output driver, which is coupled via a bond wire 502 or via solder bump or other electrical connection to an external pin of the integrated circuit 503. The integrated circuit can therefore be incorporated into a circuit, with an electrical connection to the single-ended pseudo-differential output driver made to another circuit component via an electrical connection to integrated circuit pin 503.

Examples of integrated circuits include amplifiers, processors, memory, and computer chipsets such as memory controllers. A memory integrated circuit stores digital data in memory circuits formed on an integrated circuit such as 501, and communicates data to other circuits such as a memory controller or processor via pseudo-differential single-ended output pin 503. Similarly, a memory controller integrated circuit or processor are typically formed of various electrical components on a die such as die 501, and can send electrical signals to other electronic components via a pseudo-differential single-ended output driver circuit coupled to an external electrical connection such as pin 503.

These examples given here illustrate how a pseudo-differential single-ended output driver may be implemented using various components, and how such a circuit may be applied to various applications. Although specific embodiments have been illustrated and described herein, it will be appreciated by those of ordinary skill in the art that any arrangement which is calculated to achieve the same purpose may be substituted for the specific embodiments shown. This application is intended to cover any adaptations or variations of the invention. It is intended that this invention be limited only by the claims, and the full scope of equivalents thereof.

We claim:

1. A pseudo-differential driver circuit, comprising:
   a first transistor having a gate coupled to receive a first part of a differential signal;
   a second transistor having a gate coupled to receive a second part of the differential signal varying opposite the first part of the differential signal, a source of the second transistor coupled to a source of the first transistor;
   a pull-down circuit coupling the source of the first transistor and the source of the second transistor to a ground voltage;
   a single-ended pseudo-differential output coupled to a drain of the second transistor;
   a supply voltage coupled to a drain of the second transistor; and
   a third transistor directly electrically coupling the supply voltage to a drain of the first transistor such that the third transistor's source is directly electrically coupled to the supply voltage and the third transistor's drain is directly electrically coupled to the first transistor's drain, the third transistor gate coupled to a control signal operable to cause approximately the same current to flow through the first transistor and the second transistor.

2. The pseudo-differential driver circuit of claim 1, further comprising:
   a fourth transistor coupling the drain of the first transistor to a supply voltage, such that the source of the fourth transistor is coupled to the supply voltage, the gate of the fourth transistor is coupled to receive the first part of the differential signal, and the drain of the fourth transistor is coupled to the drain of the first transistor; and
   a fifth transistor coupling the drain of the second transistor to a supply voltage, such that the source of the fifth transistor is coupled to the supply voltage, the gate of the fifth transistor is coupled to receive the second part of the differential signal, and the drain of the fifth transistor is coupled to the drain of the second transistor.

3. The pseudo-differential driver circuit of claim 2, wherein:
   the drain of the fourth transistor is coupled to the drain of the first transistor via one or more resistors; and
   the drain of the fifth transistor is coupled to the drain of the second transistor via one or more resistors.

4. The pseudo-differential driver circuit of claim 1, wherein the drain of the second transistor is coupled to the output via one or more resistors.

5. The pseudo-differential driver circuit of claim 1, wherein the output is coupled to the supply voltage via one or more resistors.

6. The pseudo-differential driver circuit of claim 1, wherein the pull-down circuit comprises a variable impedance that is adjustable to control the current flowing through the pull-down network.

7. The pseudo-differential driver circuit of claim 1, wherein the control signal is derived from detecting current flowing in at least one of the pull-down network and the second transistor.

8. A memory module, comprising:
a memory operable to store electronic data;
a memory module interface comprising a pseudo-differential output, the pseudo-differential output comprising:
   a first transistor having a gate coupled to receive a first part of a differential signal;
   a second transistor having a gate coupled to receive a second part of the differential signal varying opposite the first part of the differential signal, a source of the second transistor coupled to a source of the first transistor;
   a pull-down circuit coupling the source of the first transistor and the source of the second transistor to a ground voltage;
   a single-ended memory module output coupled to a drain of the second transistor;
   a supply voltage coupled to a drain of the second transistor; and
   a third transistor directly electrically coupling the supply voltage to a drain of the first transistor such that the third transistor's source is directly electrically coupled to the supply voltage and the third transistor's drain is directly electrically coupled to the first transistor's drain, the third transistor gate coupled to a control signal operable to cause approximately the same current to flow though the first transistor and the second transistor.

9. The memory module of claim 8, the pseudo-differential driver circuit further comprising:
   a fourth transistor coupling the drain of the first transistor to a supply voltage, such that the source of the fourth transistor is coupled to the supply voltage, the gate of the fourth transistor is coupled to receive the first part of the differential signal, and the drain of the fourth transistor is coupled to the drain of the first transistor; and
   a fifth transistor coupling the drain of the second transistor to a supply voltage, such that the source of the fifth transistor is coupled to the supply voltage, the gate of the fifth transistor is coupled to receive the second part of the differential signal, and the drain of the fifth transistor is coupled to the drain of the second transistor.

10. The memory module of claim 8, wherein:
the drain of the fourth transistor is coupled to the drain of the first transistor via one or more resistors; and
the drain of the fifth transistor is coupled to the drain of the second transistor via one or more resistors.

11. The memory module of claim 8, wherein the memory module output is coupled to the drain of the second transistor via one or more resistors.

12. The memory module of claim 8, wherein the pull-down circuit comprises a variable impedance that is adjustable to control the current flowing through the pull-down network.

13. The memory module of claim 8, wherein the control signal is derived from detecting current flowing in at least one of the pull-down network and the second transistor.

14. A memory controller, comprising:
control logic operable to manage a pool of memory; and
a memory interface that includes a pseudo-differential output comprising:
   a first transistor having a gate coupled to receive a first part of a differential signal;
   a second transistor having a gate coupled to receive a second part of the differential signal varying opposite the first part of the differential signal, a source of the second transistor coupled to a source of the first transistor;
   a pull-down circuit coupling the source of the first transistor and the source of the second transistor to a ground voltage;
   a single-ended memory controller output coupled to a drain of the second transistor;
   a supply voltage coupled to a drain of the second transistor; and
   a third transistor directly electrically coupling the supply voltage to a drain of the first transistor such that the third transistor's source is directly electrically coupled to the supply voltage and the third transistor's drain is directly electrically coupled to the first transistor's drain, the third transistor gate coupled to a control signal operable to cause approximately the same current to flow through the first transistor and the second transistor.

15. The memory controller of claim 14, the pseudo-differential driver circuit further comprising:
   a fourth transistor coupling the drain of the first transistor to a supply voltage, such that the source of the fourth transistor is coupled to the supply voltage, the gate of the fourth transistor is coupled to receive the first part of the differential signal, and the drain of the fourth transistor is coupled to the drain of the first transistor; and
   a fifth transistor coupling the drain of the second transistor to a supply voltage, such that the source of the fifth transistor is coupled to the supply voltage, the gate of the fifth transistor is coupled to receive the second part of the differential signal, and the drain of the fifth transistor is coupled to the drain of the second transistor.

16. The memory controller of claim 14, wherein:
the drain of the fourth transistor is coupled to the drain of the first transistor via one or more resistors; and
the drain of the fifth transistor is coupled to the drain of the second transistor via one or more resistors.

17. The memory controller of claim 14, wherein the memory controller output is coupled to the drain of the second transistor via one or more resistors.

18. The memory controller of claim 14, wherein the pull-down circuit comprises a variable impedance that is adjustable to control the current flowing through the pull-down network.

19. The memory controller of claim 14, wherein the control signal is derived from current detected in at least one of the pull-down network and the second transistor.

20. An integrated circuit, comprising:
a substrate;
a plurality of external electrical contacts; and
at least one output circuit, the output circuit comprising:
   a first transistor having a gate coupled to receive a first part of a differential signal;

a second transistor having a gate coupled to receive a second part of the differential signal varying opposite the first part of the differential signal, a source of the second transistor coupled to a source of the first transistor;

a pull-down circuit coupling the source of the first transistor and the source of the second transistor to a ground voltage;

a single-ended pseudo-differential output coupled to a drain of the second transistor;

a supply voltage coupled to a drain of the second transistor; and a third transistor directly electrically coupling the supply voltage to a drain of the first transistor such that the third transistor's source is directly electrically coupled to the supply voltage and the third transistor's drain is directly electrically coupled to the first transistor's drain, the third transistor gate coupled to a control signal operable to cause approximately the same current to flow through the first transistor and the second transistor.

* * * * *

UNITED STATES PATENT AND TRADEMARK OFFICE
CERTIFICATE OF CORRECTION

PATENT NO. : 7,233,201 B2
APPLICATION NO. : 10/931362
DATED : June 19, 2007
INVENTOR(S) : King et al.

It is certified that error appears in the above-identified patent and that said Letters Patent is hereby corrected as shown below:

In column 2, lines 8-9, delete "pseud-differential" and insert -- pseudo-differential --, therefor.

In column 5, lines 65-66, delete "speudo-differential" and insert -- pseudo-differential --, therefor.

In column 6, line 39 (Approx.), in Claim 2, delete "frirther" and insert -- further --, therefor.

In column 7, line 35, in Claim 8, delete "though" and insert -- through --, therefor.

Signed and Sealed this

Eleventh Day of September, 2007

JON W. DUDAS
*Director of the United States Patent and Trademark Office*